(12) United States Patent
Lee et al.

(10) Patent No.: US 6,996,025 B2
(45) Date of Patent: Feb. 7, 2006

(54) INTEGRATED CIRCUIT MEMORY DEVICES HAVING ZIG-ZAG ARRANGEMENTS OF COLUMN SELECT IO BLOCKS TO INCREASE INPUT/OUTPUT LINE ROUTING EFFICIENCY

(75) Inventors: Hyun-Seok Lee, Seoul (KR);
Kyung-Ho Kim, Gyeonggi-do (KR);
Hyeun-Su Kim, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/774,902

(22) Filed: Feb. 9, 2004

(65) Prior Publication Data

US 2004/0257899 A1  Dec. 23, 2004

(30) Foreign Application Priority Data

Jun. 17, 2003  (KR) ...................... 10-2003-0039226

(51) Int. Cl.
*G11C 8/00*  (2006.01)

(52) U.S. Cl. ............... 365/230.03; 365/63; 365/230.01
(58) Field of Classification Search ........... 365/230.03, 365/230.04, 230.01, 230.06, 63
See application file for complete search history.

(56) References Cited

U.S. PATENT DOCUMENTS

| | | | |
|---|---|---|---|
| 5,475,647 A * | 12/1995 | Yim et al. ............. | 365/230.03 |
| 5,485,426 A | 1/1996 | Lee et al. | |
| 5,650,975 A * | 7/1997 | Hamade et al. ........ | 365/230.01 |
| 5,701,268 A | 12/1997 | Lee et al. | |
| 5,949,697 A | 9/1999 | Lee | |
| 5,978,307 A | 11/1999 | Proebsting et al. | |
| 5,982,700 A | 11/1999 | Proebsting | |
| 5,986,942 A | 11/1999 | Sugibayashi | |
| 6,046,950 A | 4/2000 | Kim | |
| 6,067,270 A | 5/2000 | Hwang | |
| 6,154,416 A | 11/2000 | Lee et al. | |
| RE36,993 E | 12/2000 | Takashima et al. | |
| 6,246,614 B1 * | 6/2001 | Ooishi ........................ | 365/191 |
| 6,327,214 B1 | 12/2001 | Yoon et al. | |
| 6,345,011 B2 * | 2/2002 | Joo et al. ............... | 365/230.03 |
| 6,396,756 B1 | 5/2002 | Kang et al. | |

* cited by examiner

*Primary Examiner*—Gene N. Auduong
(74) *Attorney, Agent, or Firm*—Myers Bigel Sibley & Sajovec PA

(57) ABSTRACT

Integrated circuit memory devices include sense amplifier arrays having layouts that are configured to support greater pitch between adjacent input/output lines, while maintaining high levels of integration density. A sense amplifier array is provided having first and second column select I/O blocks that are arranged in an alternating zig-zag layout sequence, with the first column select I/O blocks positioned in a first row of the sense amplifier array and the second column select I/O blocks positioned in a second row of the sense amplifier array. The sense amplifier array also includes an alternating zig-zag layout sequence of first and second N-type (or P-type) sense amplifier blocks that extends back-and-forth between the first and second rows. The zig-zag layout sequence of sense amplifier blocks is interleaved with the zig-zag layout sequence of the column select I/O blocks.

20 Claims, 10 Drawing Sheets

US 6,996,025 B2

INTEGRATED CIRCUIT MEMORY DEVICES HAVING ZIG-ZAG ARRANGEMENTS OF COLUMN SELECT IO BLOCKS TO INCREASE INPUT/OUTPUT LINE ROUTING EFFICIENCY

REFERENCE TO PRIORITY APPLICATION

This application claims priority to Korean Application Serial No. 2003-39226, filed Jun. 17, 2003, the disclosure of which is hereby incorporated herein by reference.

FIELD OF THE INVENTION

The present invention relates to integrated circuit devices and, more particularly, to multi-bank integrated circuit memory devices.

BACKGROUND OF THE INVENTION

Integrated circuit memory devices containing multiple banks of memory arrays frequently utilize shared data routing circuitry to support efficient write and read operations. An example of a data routing circuit that is shared by multiple memory arrays is illustrated by FIG. 1. In particular, FIG. 1 illustrates an input/output data routing circuit 20 that is electrically coupled to a pair of memory cell arrays 10a and 10b, which are shown as including dynamic random access (DRAM) memory cells (MC). The illustrated memory cells MC in the pair of memory cell arrays 10a and 10b are electrically coupled to the input/output data routing circuit 20 by respective pairs of differential bit lines BL and /BL.

The input/output data routing circuit 20 includes left and right equalization and isolation circuits 12a and 12b that are electrically coupled by corresponding pairs of differential bit lines BL and /BL to respective columns of memory cells within the memory cell arrays 10a and 10b. The left equalization and isolation circuit 12a is illustrated as including three NMOS equalization transistors that are responsive to an active high first equalization signal PEQi. Switching this first equalization signal PEQi from low-to-high operates to pull the corresponding bit lines to an equivalent voltage Vequal having a magnitude about equal to a voltage of the VBL reference line (e.g., Vequal=VBL−Vth, where Vth is a threshold voltage of an NMOS transistor). The left equalization and isolation circuit 12a also includes a pair of NMOS pass transistors that are responsive to a first isolation signal PISOi. When the first isolation signal PISOi is switched low-to-high, the pair of differential bit lines BL and /BL from the left memory cell array 10a are electrically connected to a pair of differential sense bit lines SBL and /SBL. Similarly, the right equalization and isolation circuit 12b is illustrated as including three NMOS equalization transistors that are responsive to an active high second equalization signal PEQj. Switching of this second equalization signal PEQj from low-to-high operates to pull the corresponding bit lines to the equivalent voltage Vequal. The right equalization and isolation circuit 12b also includes a pair of NMOS pass transistors that are responsive to a second isolation signal PISOj. When the second isolation signal is switched low-to-high, the pair of differential bit lines BL and /BL from the right memory cell array 10b are electrically connected to the pair of differential sense bit lines SBL and /SBL. As will be understood by those skilled in the art, in order to provide adequate isolation between the memory arrays, the first and second isolation signals are not active during overlapping time intervals.

A P-type sense amplifier block 14 and an N-type sense amplifier block 18 collectively form a sense amplifier that is responsive to a pair of complementary control signals LA and LAB. When the control signal LA is switched low-to-high and the control signal LAB is switched high-to-low, the P-type sense amplifier block 14 and the N-type sense amplifier block 18 become active and operate to sense and amplify any differential signal established across the pair of sense bit lines SBL and /SBL. A column select IO block 16 is also provided in a column gate region (CGR). This column select IO block 16 includes a pair of NMOS transistors that are responsive to a column select signal (shown as CSL0). When the illustrated column select signal CSL0 is switched low-to-high, a rail-to-rail signal established across the sense bit lines SBL and /SBL is transferred to a pair of input/output lines IO and IOB during a read operation (or vice versa during a write operation). These input/output lines IO and IOB are illustrated as extending orthogonal to the bit lines BL and BLB. These and other aspects of the input/output data routing circuit of FIG. 1 are more fully described in commonly assigned U.S. Pat. Nos. 5,701,268, 6,046,950 and 6,396,756. Multi-bank memory devices with input/output routing circuitry are also disclosed in commonly assigned U.S. Pat. Nos. 5,485,426, 5,949,697, 6,067,270 and 6,327,214.

The layout of the input/output data routing circuit 20 of FIG. 1 may result in many closely spaced pairs of input/output lines IO and IOB when multiple data routing circuits 20 are positioned side-by-side in the direction of the input/output lines IO and IOB. An example of a memory device that utilizes closely spaced input/output lines IO and IOB is illustrated by FIG. 2, which is a reproduction of FIG. 3 of U.S. Pat. No. 6,345,011 to Joo et al. In FIG. 2, a multi-bank memory device is illustrated as including memory banks MB0, MB1 and MB2. A first sense amplifier block SABLK0 extends between memory banks MB0 and MB1 and a second sense amplifier block SABLK1 extends between memory banks MB1 and MB2. These memory banks are illustrated has having 2052 pairs of bit lines (BL0, /BL0 to BL2051, /BL2051), with the even pairs of bit lines extending to one sense amplifier block and the odd pairs of bit lines extending to another sense amplifier block. Each of the sense amplifier blocks SABLK0 and SABLK1 includes a left side bit isolation circuit 50, a right side bit isolation circuit 60 and a bit line precharging and equalization circuit 70 of conventional design (see, e.g., FIG. 1). A P-type sense amplifier circuit 80 and an N-type sense amplifier circuit 90 are also provided on opposite sides of a column select IO circuit 100, which is responsive to column select signals (e.g., CSL0–CSL512). The column select IO circuit 100 is illustrated as including a plurality of column select IO blocks that are arranged side-by-side in a single row, with each block including a pair of column selection transistors (GT). Each pair of column selection transistors GT routes data from a corresponding pair of sense bit lines to a respective pair of closely spaced input/output (IO) lines, shown as (IOi, /IOi), (IOj, /IOj), (IOk,/IOk) and (IOl, /IOl), and vice versa, when a respective column select signal is active.

Unfortunately, such close spacing of the IO lines can result in reliability failures when a sufficient layout pitch is not maintained between the adjacent lines. To address this possibility of reliability failures, the layout area of the column select IO circuit 100 can be increased, but such area increases result in lower integration densities and/or lower memory bandwidth, which is a function of memory speed and data path bandwidth.

One attempt to address the reliability and/or data path bandwidth limitations associated with the memory device of FIG. 2 utilizes the column select IO circuit of FIG. 3, which is a reproduction of FIG. 5 of the Joo et al. patent. As illustrated by FIG. 3, an interface region 200 is provided between upper array (UA) portions of the memory blocks and lower array (LA) portions of the memory blocks. This interface region 200 provides sufficient area to reroute input/output lines IOi, IOj, /IOi and /IOj associated with the upper array (UA) away from the input/output lines IOk, IOl, /IOk and /IOl associated with the lower array (LA), and thereby maintain sufficient pitch between adjacent IO lines. However, as illustrated by FIGS. 6B and 6C of the Joo et al. patent, the rerouting of input/output lines may require the use of additional levels of metallization and contact vias and thereby complicate the process for fabricating the memory device. Moreover, the rerouting of the input/output lines may require a greater layout area to accommodate the interface region 200.

SUMMARY OF THE INVENTION

Integrated circuit memory devices according to embodiments of the present invention include sense amplifier arrays having layouts that are configured to support greater pitch between adjacent input/output lines, while maintaining high levels of integration density. In these embodiments, a sense amplifier array is provided having first and second column select I/O blocks that are arranged in an alternating zig-zag layout sequence, with the first column select I/O blocks positioned in a first row of the sense amplifier array and the second column select I/O blocks positioned in a second row of the sense amplifier array. The first and second rows of the sense amplifier array may be immediately adjacent rows within the sense amplifier array or may be separated by one or more rows containing additional logic blocks. The sense amplifier array also includes an alternating zig-zag layout sequence of first and second N-type (or P-type) sense amplifier blocks that extends back-and-forth between the first and second rows. The zig-zag layout sequence of sense amplifier blocks is interleaved with the zig-zag layout sequence of the column select I/O blocks in a criss-cross manner. According to some additional embodiments of the present invention, the first column select I/O blocks are grouped in pairs and the second column select I/O blocks are grouped in pairs within the sense amplifier array. Similarly, the first sense amplifier blocks may be grouped in pairs and the second sense amplifier blocks may be grouped in pairs.

The column select I/O blocks are responsive to column select signals (CSL) provided on column select signal lines. The layout of the column select I/O blocks and the sense amplifier blocks may be configured so that a first column select line extends between a first column select I/O block and a first N-type (or P-type) sense amplifier block in the first row and also extends between a second column select I/O block and a second N-type (or P-type) sense amplifier block in the second row. A first column select line extension may also be provided, which is electrically connected to the first column select line. This first column select line extension may extend between the first and second rows in an orthogonal direction relative to the first column select line and may comprise polycrystalline silicon (i.e., gate polysilicon (GP)).

Additional embodiments of the present invention include an integrated circuit memory device having at least first and second memory blocks therein. These first and second memory blocks are electrically coupled by respective pairs of bit lines (BL) to a shared sense amplifier array. This sense amplifier array includes an alternating zig-zag layout sequence of first and second column select I/O blocks therein that extends back-and-forth between first and second adjacent rows of the sense amplifier array. Each of these column select I/O blocks is electrically coupled by a respective pair of sense bit lines (SBL) to a respective N-type sense amplifier block and/or P-type sense amplifier block. The sense amplifier array may also include a first plurality of isolation blocks, which are electrically coupled to first ends of a plurality of pairs of sense bit lines and to the bit lines associated with the first memory block, and a second plurality of isolation blocks, which are electrically coupled to second ends of a the plurality of pairs of sense bit lines and to the bits lines associated with the second memory block. Moreover, this sense amplifier array may be configured as a plurality of sense amplifier blocks (SABLK), which are configured as column-to-I/O control blocks. In particular, a first column-to-I/O control block may be provided with a first pair of sense bit lines that are electrically coupled to a first column select I/O block and a first N-type (P-type) sense amplifier block. In addition, a second column-to-I/O control block may be provided with a second pair of sense bit lines that are electrically coupled to a second column select I/O block, which extends opposite the first N-type (P-type) sense amplifier block, and a second N-type (P-type) sense amplifier block, which extends opposite the first column select I/O block.

Still further embodiments of the present invention include a sense amplifier array having a criss-cross arrangement of column select I/O blocks and sense amplifier blocks therein that collectively form a unit cell layout structure having first and third quadrants that contain first and second column select I/O blocks, respectively, and second and fourth quadrants that contain first and second sense amplifier blocks, respectively. Here, the first column select I/O block includes a first pair of transistors that are configured to electrically connect a first pair of sense bit lines to a first pair of I/O lines in response to a first column select signal. Similarly, the second column select I/O block includes a second pair of transistors that are configured to electrically connect a second pair of sense bit lines to a second pair of I/O lines in response to the first column select signal.

DETAILED DESCRIPTION OF PREFERRED EMBODIMENTS

Figure 1:
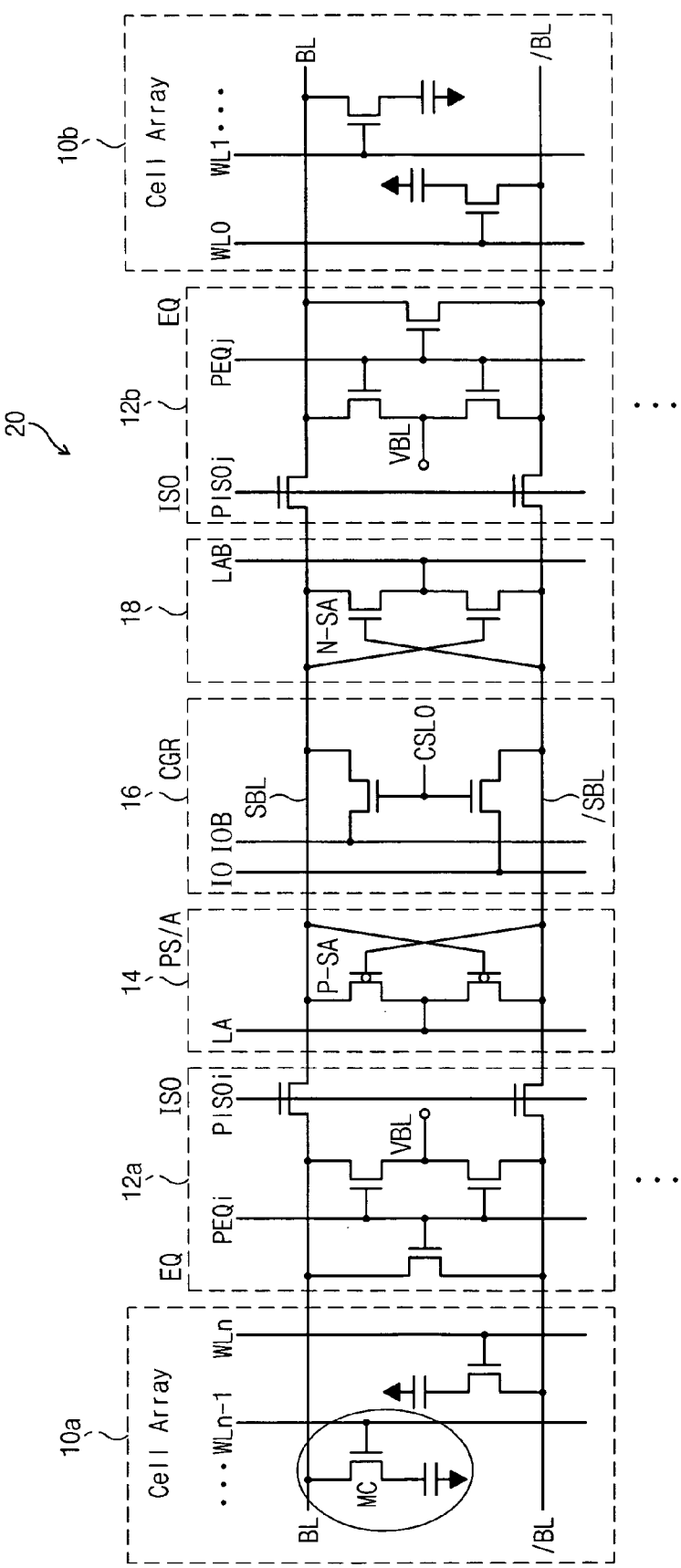
FIG. 1 is an electrical schematic of a conventional input/output data routing circuit.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal.

Figure 3:
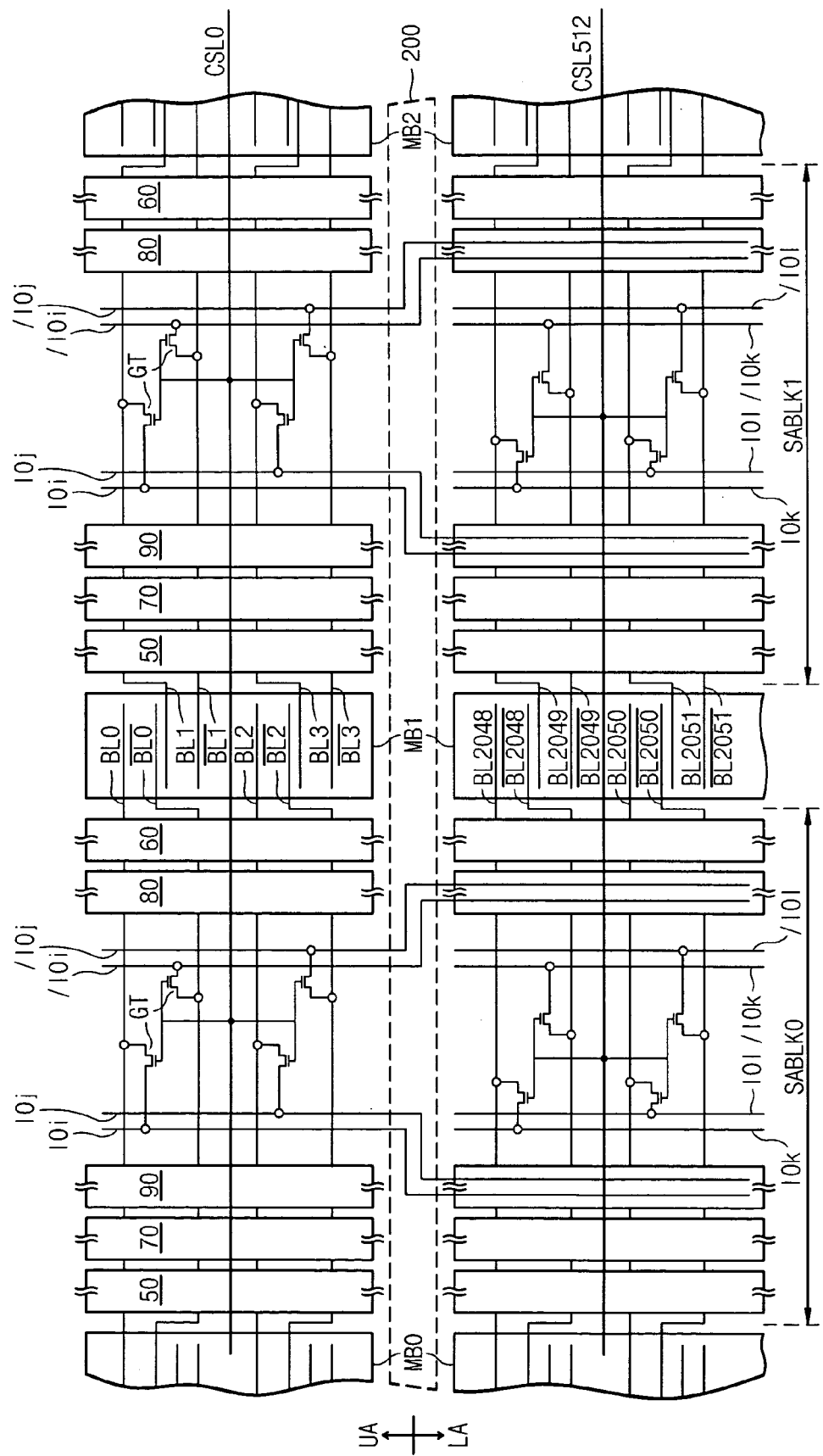
FIG. 3 is an electrical schematic of a memory device that utilizes another conventional input/output data routing circuit.
Figure 4A:
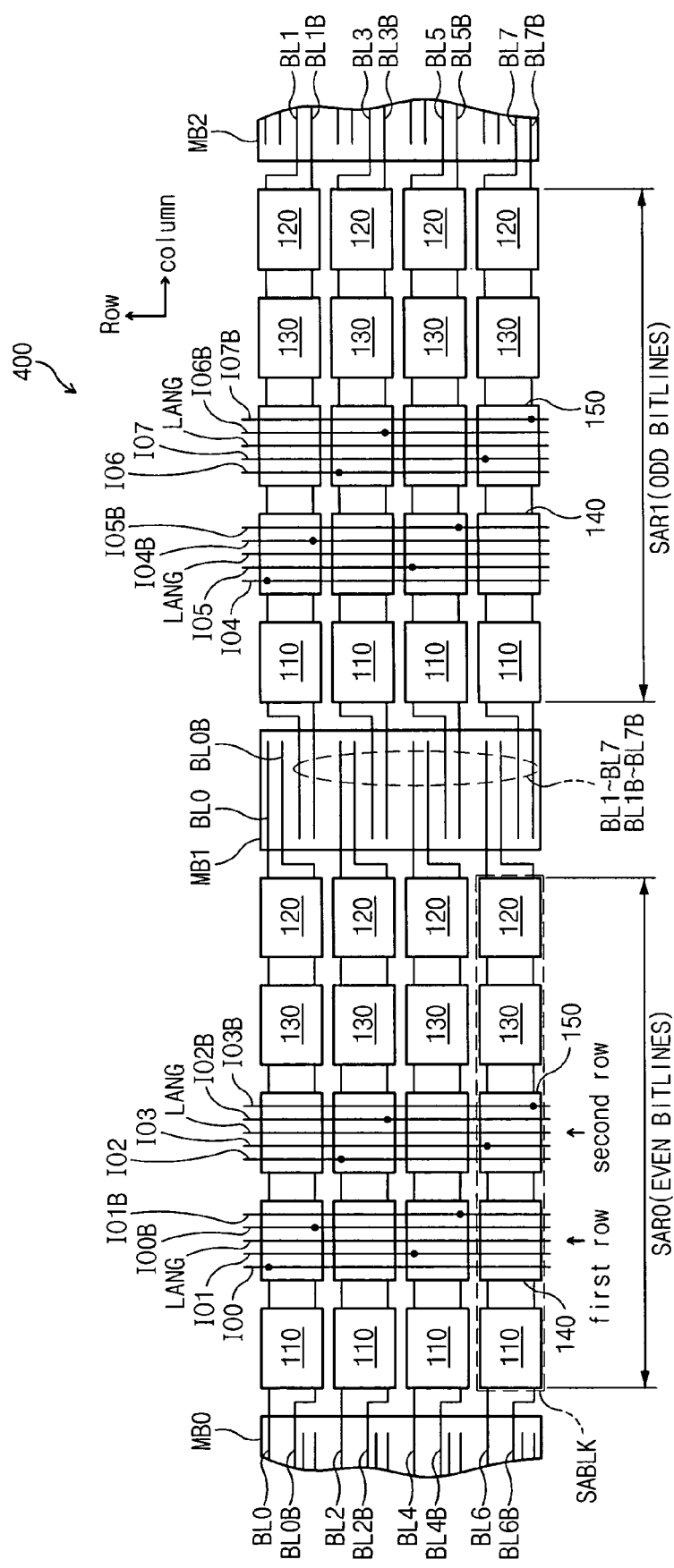
FIG. 4A is a block diagram of a memory device having an input/output data routing circuit according to an embodiment of the present invention.
Figure 4B:
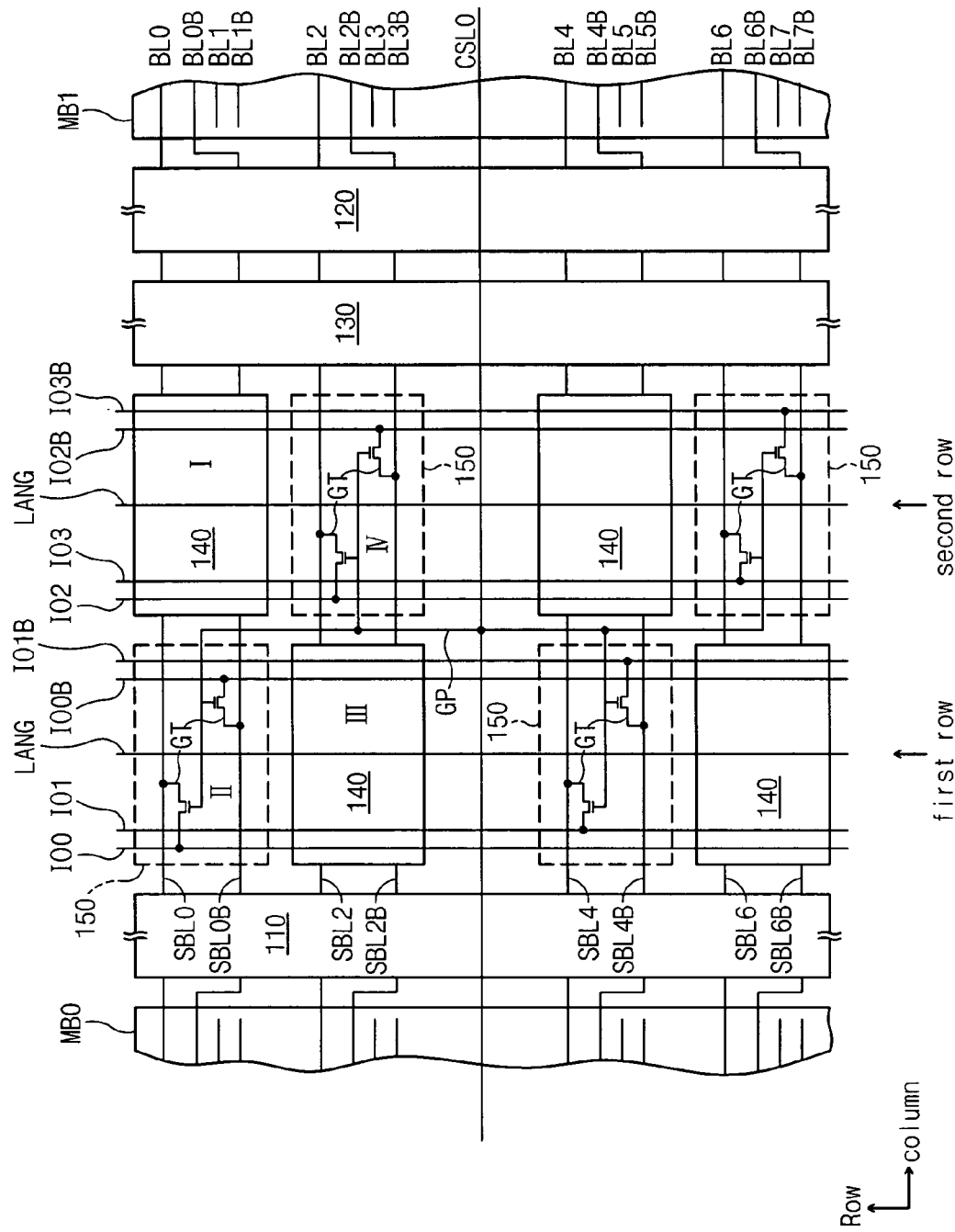
FIG. 4B is an electrical schematic of a portion of the input/output data routing circuit of FIG. 4A.
Figure 6:
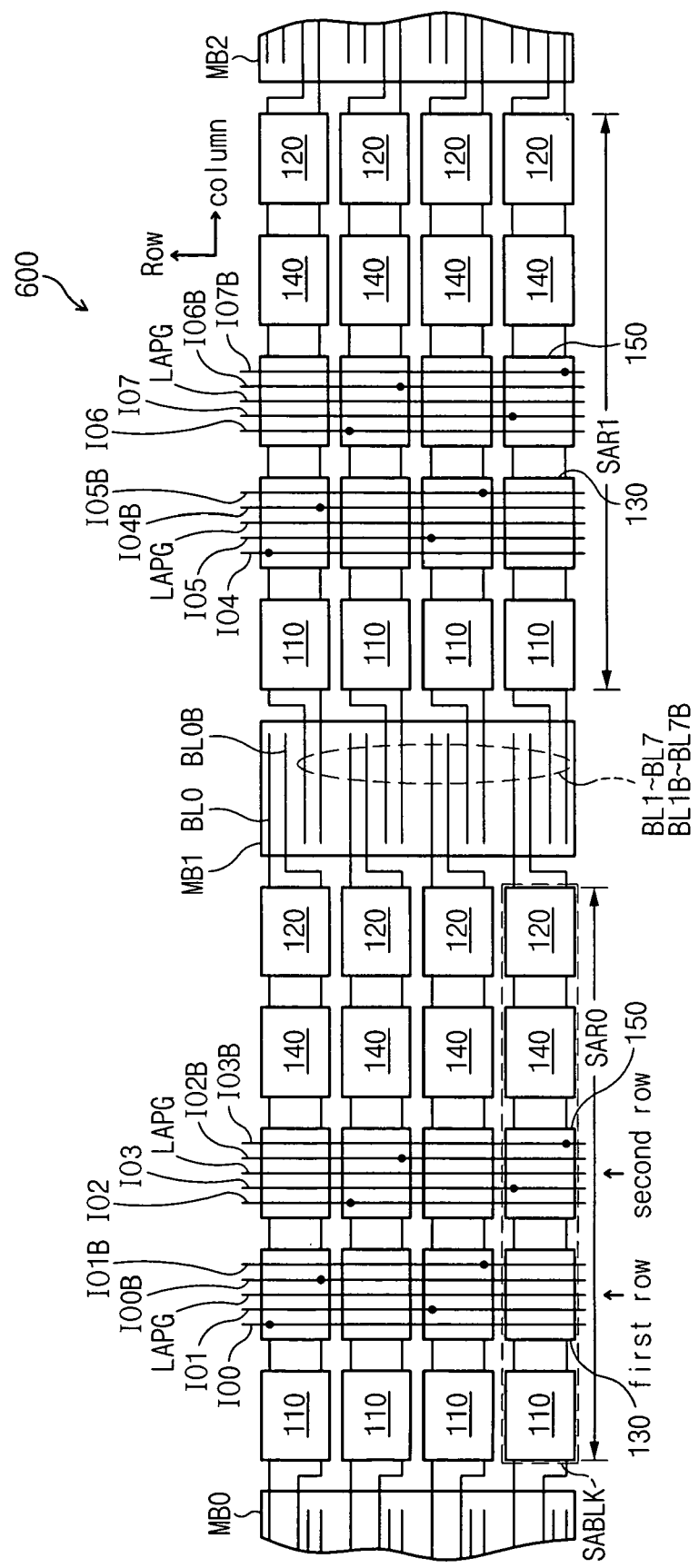
FIG. 6 is an electrical schematic of a memory device that utilizes a zig-zag arrangement of P-type sense amplifier blocks within an input/output data routing circuit, according to embodiments of the present invention.
Figure 7:
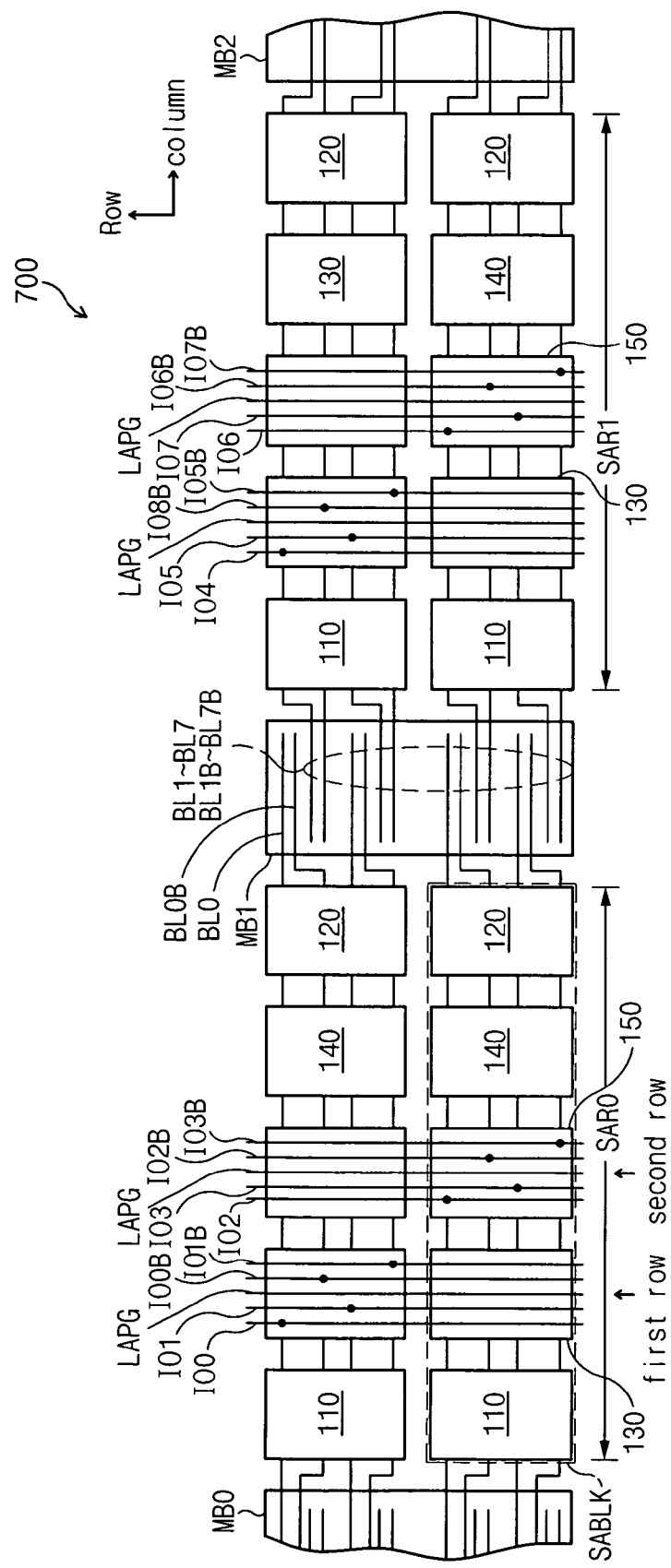
FIG. 7 is an electrical schematic of a memory device that utilizes a zig-zag arrangement of P-type sense amplifier blocks arranged in pairs within an input/output data routing circuit, according to embodiments of the present invention.

Referring now to FIGS. 4A–4B, an integrated circuit memory device 400 according to an embodiment of the present invention will be described. The memory device 400 is illustrated as including a plurality of memory banks (e.g., arrays), which are shown as MB0, MB1 and MB2. The even pairs of bit lines ((BL0, BL0B), . . . (BL6, BL6B)) that extend from each column of MB0 and MB1 are electrically coupled to a corresponding plurality of sense amplifier blocks (SABLK). These sense amplifier blocks, which are arranged side-by-side in a zeroth sense amplifier region (SAR0), operate as respective column-to-I/O control blocks having isolation blocks, equalization blocks, sense amplifier blocks and column select I/O blocks therein. Likewise, the odd pairs of bit lines ((BL1, BL1B), . . . , (BL7, BL7B)) that extend from each column of MB1 and MB2 are electrically coupled to a corresponding plurality of sense amplifier blocks SABLK, which are arranged side-by-side in a first sense amplifier region (SAR1). The zeroth sense amplifier region SAR0 includes first and second rows of blocks. The first row of blocks in SAR0 is associated with a plurality of input/output lines IO0, IO0B, IO1, IO1B and a control line LANG. The second row of blocks in SAR0 is associated with a plurality of input/output lines IO2, IO2B, IO3, IO3B and a control line LANG. The first sense amplifier region SAR1 also includes first and second rows of blocks. The first row of blocks in SAR1 is associated with a plurality of input/output lines IO4, IO4B, IO5, IO5B and a control line LANG and the second row of blocks is associated with a plurality of input/output lines IO6, IO6B, IO7, IO7B and a control line LANG. As illustrated more fully by FIG. 3 of commonly assigned U.S. Pat. No. 5,701,268, corresponding control signals provided on the control lines LANG may be used to generate the control signal LAB, which is used by N-type sense amplifier blocks (see, e.g., the N-type sense amplifier block 18 in FIG. 1). Similarly, as illustrated by FIGS. 6–7, control signals provided on the control lines LAPG may be used to generate the control signals LA, which is used by P-type sense amplifier blocks (see, e.g., the P-type sense amplifier block 14 in FIG. 1).

Each sense amplifier block SABLK is illustrated as including a first bit line equalization and isolation block 110 and a second bit line equalization and isolation block 120, which may be configured in accordance with the equalization and isolation circuits 12a and 12b of FIG. 1. Each sense amplifier block SABLK also includes a P-type sense amplifier block 130, an N-type sense amplifier block 140 and a column select IO block 150, which may be configured in accordance with the corresponding blocks of FIG. 1. However, to increase input/output line routing efficiency, the column select IO blocks 150 and the N-type sense amplifier blocks 140 are arranged in a zig-zag layout pattern that spans the first and second rows of the zeroth sense amplifier region SAR0. Equivalent column select IO blocks 150 and N-type sense amplifier blocks 140 are also arranged in a zig-zag layout pattern that spans the first and second rows of the first sense amplifier region SAR1.

This zig-zag arrangement of the N-type sense amplifier blocks 140 and the column select IO blocks 150 is more fully illustrated by FIG. 4B, which is a detailed electrical schematic of the zeroth sense amplifier region SAR0 of FIG. 4A. In particular, FIG. 4B illustrates four column select IO blocks 150 that are responsive to a zeroth column select signal CSL0. Two of these column select IO blocks 150 are disposed in the first row of SAR0 and the other two are disposed in the second row of SAR0. Collectively, the illustrated column select IO blocks 150 are arranged in a zig-zag pattern, as illustrated. The column select IO block 150 associated with the zeroth pair of sense bit lines SBL0 and SBL0B includes two column selection transistors GT, which electrically connect the sense bit lines SBL0 and SBL0B to the zeroth pair of input/output lines IO0 and IO0B when the zeroth column select signal CSL0 is set to an active high level. The column select IO block 150 associated with the fourth pair of sense bit lines SBL4 and SBL4B includes two column selection transistors GT, which electrically connect the sense bit lines SBL4 and SBL4B to the first pair of input/output lines IO1 and IO1B when the zeroth column select signal CSL0 is set to an active high level. Similarly, the column select IO block 150 associated with the second pair of sense bit lines SBL2 and SBL2B includes two column selection transistors GT, which electrically connect the sense bit lines SBL2 and SBL2B to the second pair of input/output lines IO2 and IO2B when the zeroth column select signal CSL0 is set to an active high level. Finally, the column select IO block 150 associated with the sixth pair of sense bit lines SBL6 and SBL6B includes two column selection transistors GT, which electrically connect the sense bit lines SBL6 and SBL6B to the first pair of input/output lines IO3 and IO3B when the zeroth column select signal CSL0 is set to an active high level.

Figure 2:
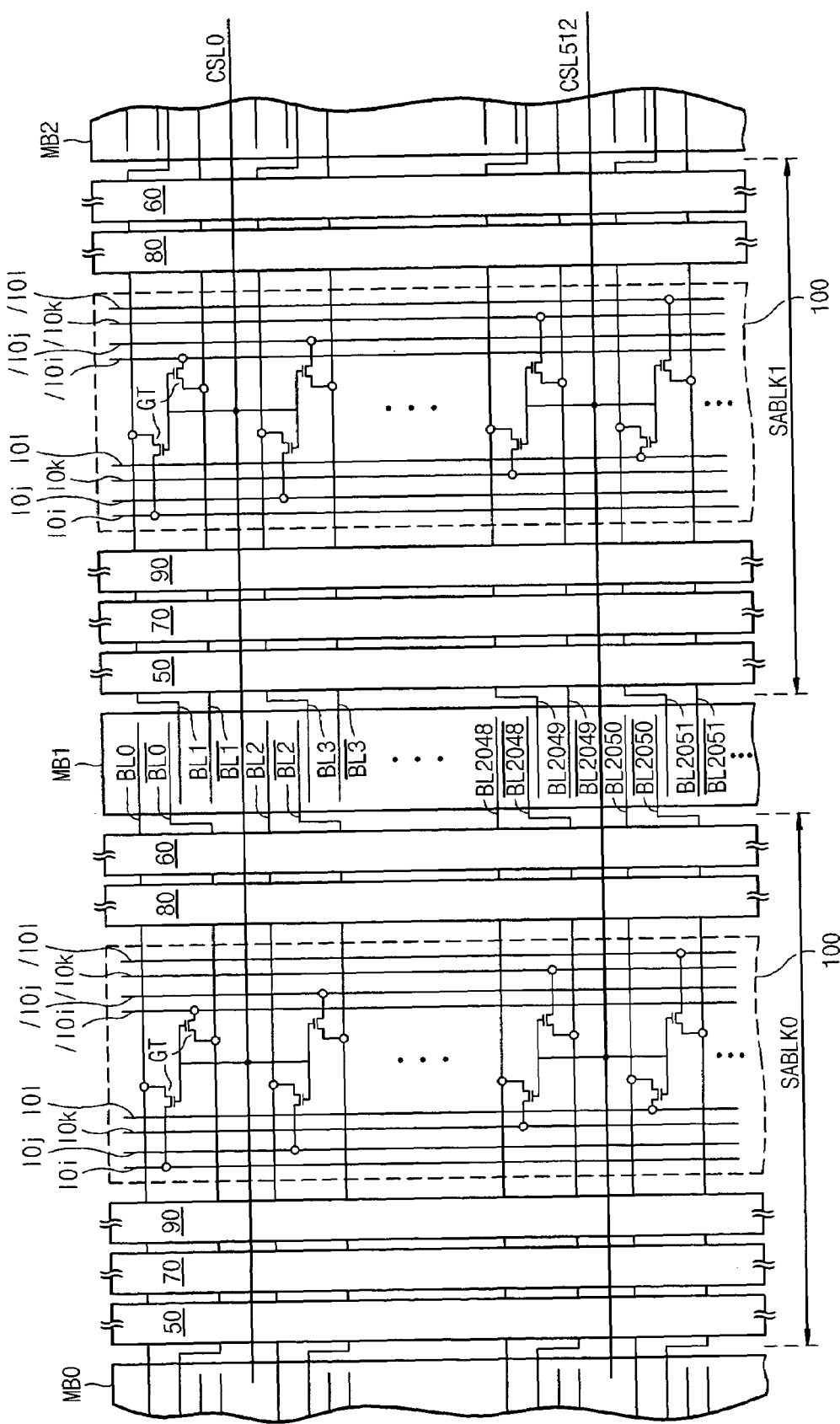
FIG. 2 is an electrical schematic of a memory device that utilizes a conventional input/output data routing circuit, which is similar to the input/output data routing circuit of FIG. 1.

FIG. 4B also illustrates how the zig-zag arrangement of the column select IO blocks 150 is interleaved with a zig-zap arrangement of the N-type sense amplifier blocks 140, which are each electrically coupled to a respective even pair of sense bit lines. This interleaved zig-zag arrangement of the N-type sense amplifier blocks 140 and the column select IO blocks 150 supports four pairs of input/output lines IO0/IO0B, IO1/IO1B, IO2/IO2B and IO3/IO3B, which may be configured to have wider layout pitch vis-a-vis the four pairs of input/output lines associated with the zeroth sense amplifier block SABLK0 in FIG. 2. In FIG. 4B, the two column select IO blocks 150 and the two N-type sense amplifier blocks 140 that are associated with two adjacent pairs of sense bit lines (e.g., SBL0/SBL0B and SBL2/SBL2B) are arranged in quadrants I-IV of a square layout cell.

Figure 8:
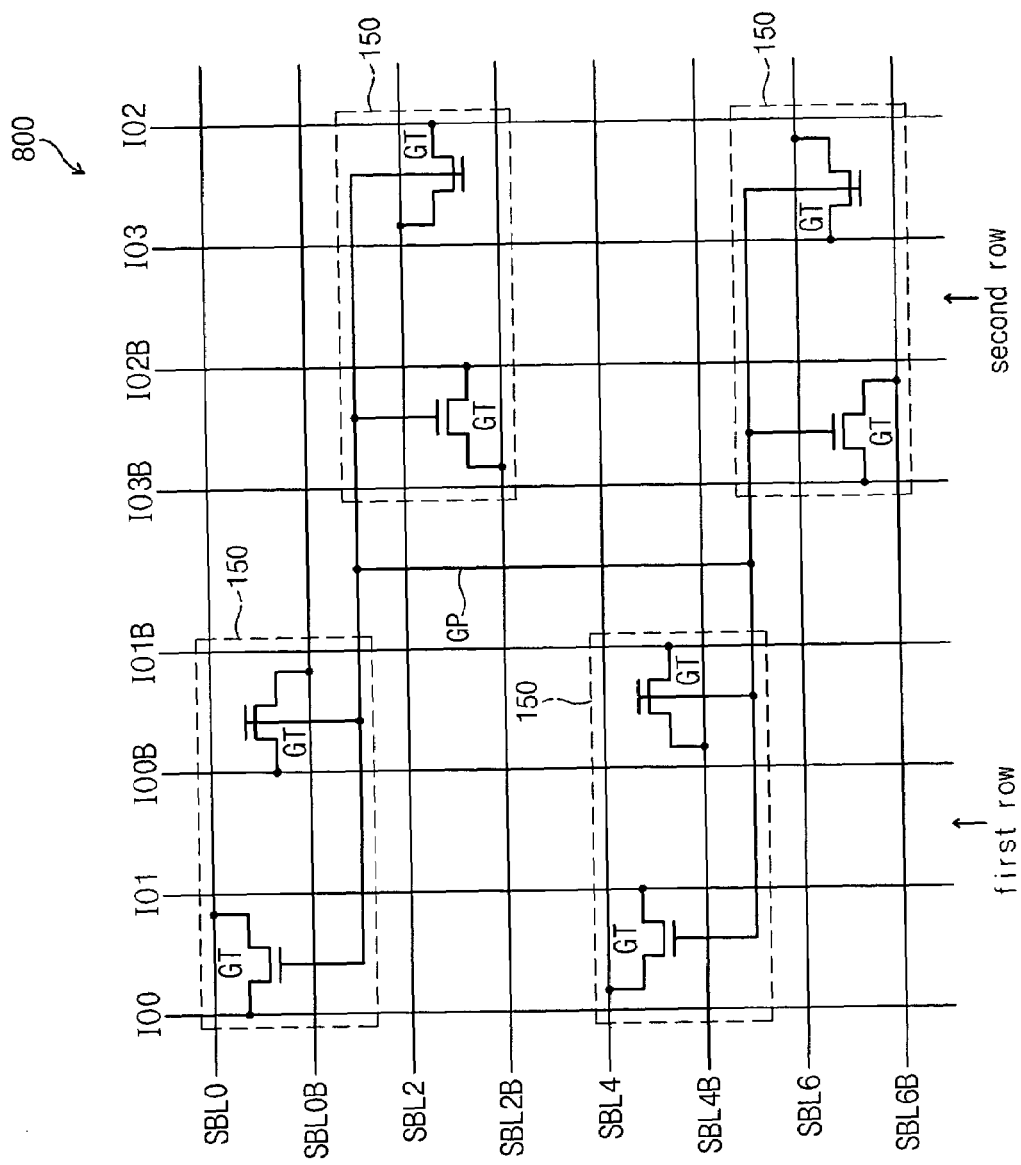
FIG. 8 is an electrical schematic that illustrates a layout arrangement of the four column select I/O blocks shown in the zeroth sense amplifier region illustrated by FIG. 4B.

The layout of the four column IO blocks 150 of FIG. 4B is further illustrated by the detailed electrical schematic of FIG. 8, which shows the layout arrangement 800 of eight (8) column selection transistors GT. These column selection transistors GT are grouped in pairs within each block 150, and each pair of transistors is electrically connected to a respective pair of sense bit lines SBL0/SBL0B, SBL2/SBL2B, SBL4/SBL4B and SBL6/SBL6B. The column selection transistors are illustrated as NMOS transistors having gate terminals that are electrically connected together by a common gate line, which is shown as a polycrystalline silicon line (i.e., gate polysilicon (GP)). This common gate line may comprise a column select line extension that extends between the first and second rows and is electrically connected to a column select line (shown as CSL0 in FIG. 4B), which may be formed at a higher level of metallization and joined to the extension by a interconnect via.

Figure 5A:
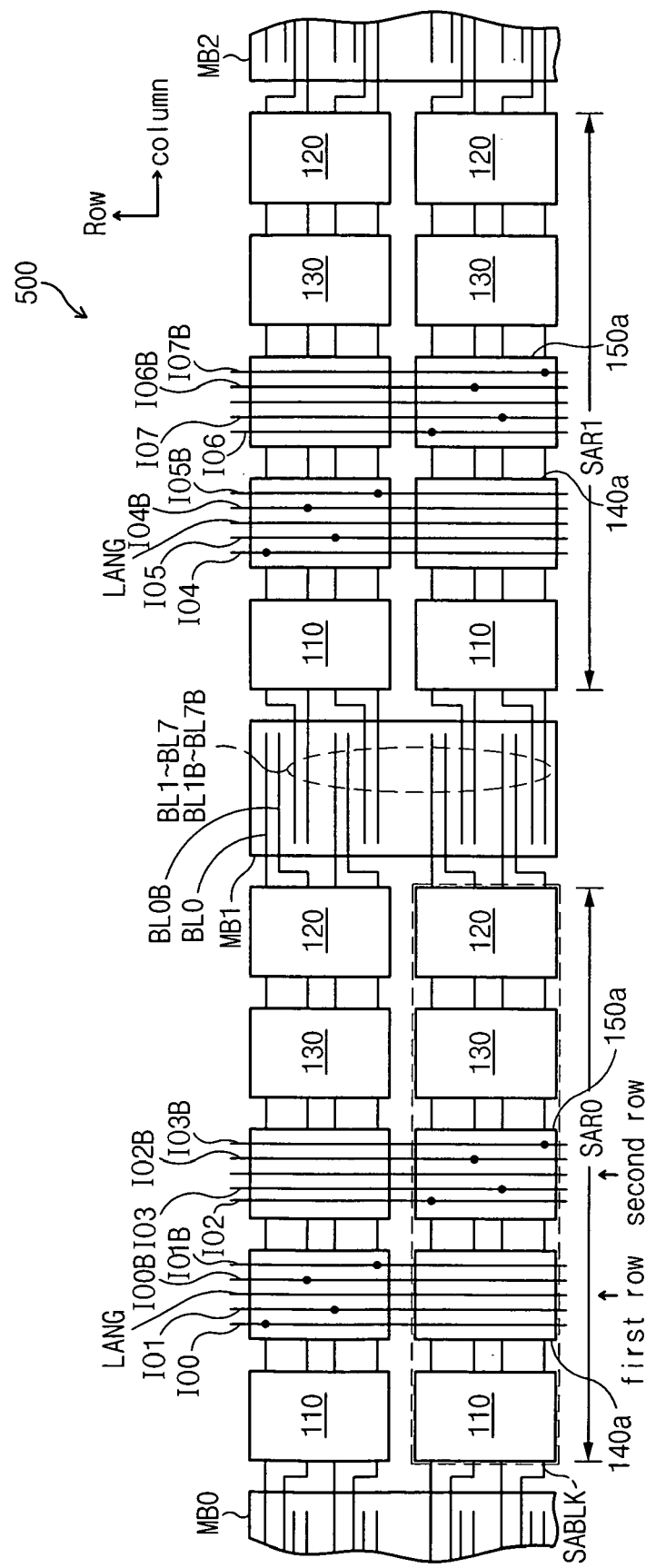
FIG. 5A is a block diagram of a memory device having an input/output data routing circuit according to another embodiment of the present invention.
Figure 5B:
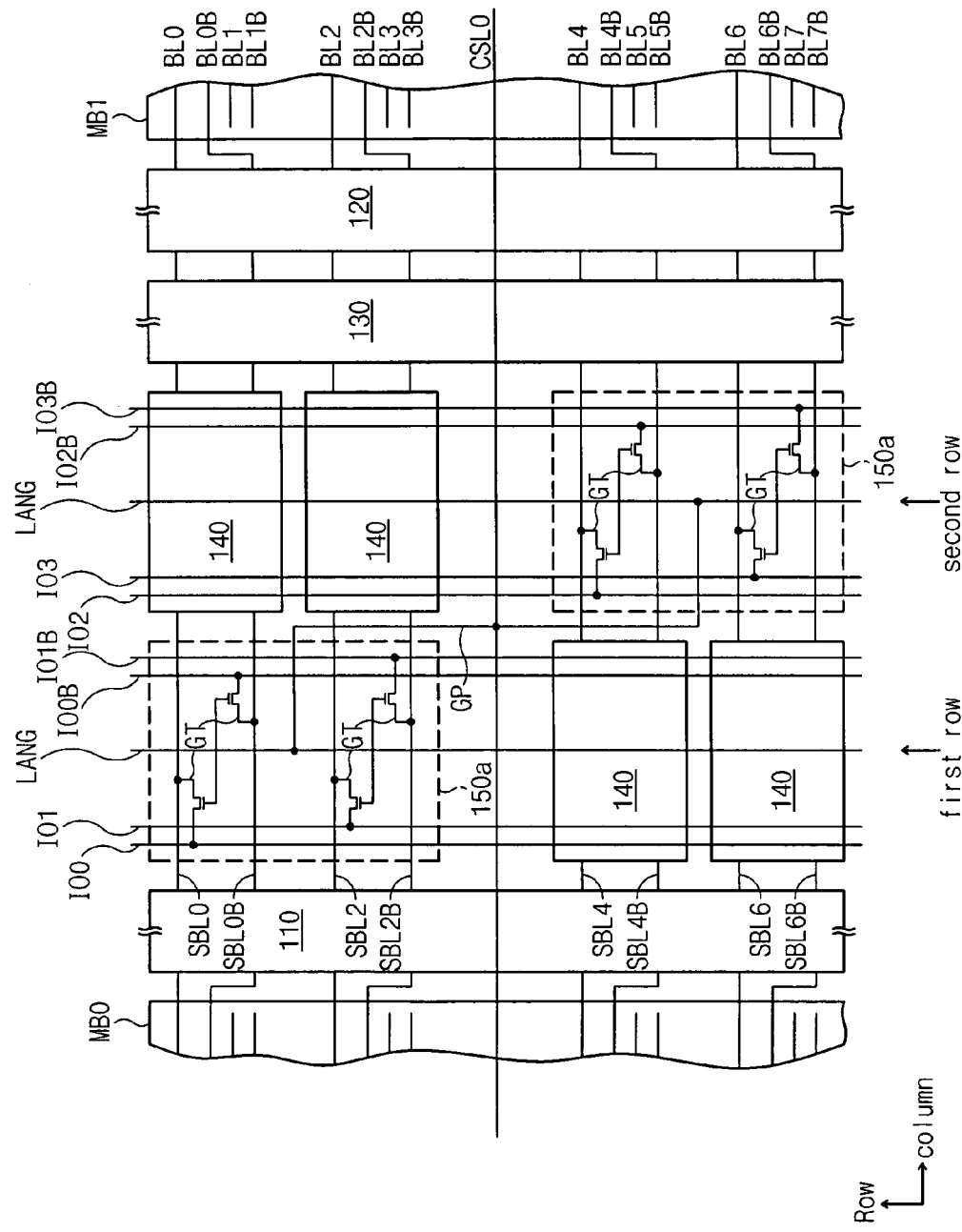
FIG. 5B is an electrical schematic of a portion of the input/output data routing circuit of FIG. 5A.

Referring now to FIGS. 5A–5B, an integrated circuit memory device 500 according to another embodiment of the present invention will be described. The memory device 500 of FIGS. 5A–5B is similar to the memory device 400 of FIGS. 4A–4B, however, each column select IO block 150 is arranged as a pair of column select IO blocks 150a that are arranged in the same row. Similarly, each N-type sense amplifier block 140 is arranged as a pair of N-type sense amplifier blocks 140a. Accordingly, the pair of column select IO blocks 150a associated with the zeroth and second pair of sense bit lines SBL0/SBL0B and SBL2/SBL2B includes four column selection transistors GT, which electrically connect the sense bit lines SBL0/SBL0B and SBL2/SBL2B to the zeroth and first pairs of input/output lines IO0/IO0B and IO1/IO1B when the zeroth column select signal CSL0 is set to an active high level. Similarly, the column select IO blocks 150a associated with the fourth and sixth pair of sense bit lines SBL4/SBL4B and SBL6/SBL6B includes four column selection transistors GT, which electrically connect the sense bit lines SBL4/SBL4B and SBL6/SBL6B to the second and third pairs of input/output lines IO2/IO2B and IO3/IO3B when the zeroth column select signal CSL0 is set to an active high level. Like the zig-zag arrangement of FIGS. 4A–4B, the paired zig-zag arrangement of the N-type sense amplifier blocks 140a and column select IO blocks 150a supports four pairs of input/output lines IO0/IO0B, IO1/IO1B, IO2/IO2B and IO3/IO3B.

Referring now to FIG. 6, an integrated circuit memory device 600 according to another embodiment of the present invention is similar to the memory device 400 of FIG. 4A, however, the positions of the N-type sense amplifier blocks 140 and the P-type sense amplifier blocks 130 within SAR0 and SAR1 are reversed. Thus, in FIG. 6, the P-type sense amplifier blocks 130 are arranged in a zig-zag pattern in the first and second rows of SAR0 and SAR1. Similarly, in FIG. 7, an integrated circuit memory device 700 is illustrated, which is similar to the memory device 500 of FIG. 5A, however, the positions of the pairs of N-type sense amplifier blocks 140a and P-type sense amplifier blocks 150a are reversed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   first and second memory blocks; and
   a sense amplifier array extending between and electrically coupled to said first and second memory blocks by first and second pluralities of pairs of bit lines, respectively, said sense amplifier array having first and second column select I/O blocks therein arranged in an alternating zig-zag layout sequence that extends between immediately opposing sides of said first and second memory blocks.

2. The memory device of claim 1, wherein said sense amplifier array has first and second rows therein that are immediately adjacent to each other; and wherein the first and second column select I/O blocks extend in the first and second rows, respectively.

3. The memory device of claim 2, wherein said sense amplifier array further comprises an alternating zig-zag layout sequence of first and second N-type (or P-type) sense amplifier blocks that extends back-and-forth between the first and second rows.

4. The memory device of claim 3, wherein the first row of said sense amplifier array has a first alternating sequence of first column select I/O blocks and first N-type (or P-type) sense amplifier blocks therein; and wherein the second row of said sense amplifier array has a second alternating sequence of second column select I/O blocks and second N-type (or P-type) sense amplifier blocks therein.

5. The memory device of claim 4, wherein the first column select I/O blocks in the first alternating sequence are grouped in pairs; and wherein the second column select I/O blocks in the second alternating sequence are grouped in pairs.

6. The memory device of claim 5, wherein the first N-type (or P-type) sense amplifier blocks in the first alternating sequence are grouped in pairs; and wherein the second N-type (or P-type) sense amplifier blocks in the second alternating sequence are grouped in pairs.

7. The memory device of claim 4, further comprising:
   a first column select line that extends between a first column select I/O block and a first N-type (or P-type) sense amplifier block in the first row and between a second column select I/O block and a second N-type (or P-type) sense amplifier block in the second row; and
   a first column select line extension that is electrically connected to said first column select line and extends between the first and second rows.

8. The memory device of claim 7, wherein said first column select line and said first column select line extension extend in orthogonal directions.

9. An integrated circuit memory device, comprising:
   first and second memory blocks; and
   a sense amplifier array that is electrically coupled to said first and second memory blocks by first and second pluralities of pairs of bit lines, respectively, said sense amplifier array having alternating zig-zag layout sequence of first and second column select I/O blocks therein that extends back-and-forth between first and second immediately adjacent rows of said sense amplifier array, which are not separated by memory cells within said first and second memory blocks.

10. The memory device of claim 9, wherein each of the first and second column select I/O blocks is electrically coupled by a respective pair of sense bit lines to a respective N-type sense amplifier block and/or P-type sense amplifier block.

11. The memory device of claim 9, wherein said sense amplifier array comprises:
   a first plurality of isolation blocks that are electrically coupled to first ends of a plurality of pairs of sense bit lines and to the first plurality of pairs of bit lines; and
   a second plurality of isolation blocks that are electrically coupled to second ends of the plurality of pairs of sense bit lines and to the second plurality of pairs of bit lines.

12. The memory device of claim 9, wherein the first column select I/O blocks are arranged in pairs; and wherein the second column select I/O blocks are arranged in pairs.

13. An integrated circuit memory device, comprising:
   a first column-to-I/O control block comprising a first pair of sense bit lines electrically coupled to a first column select I/O block and a first N-type (P-type) sense amplifier block; and
   a second column-to-I/O control block immediately adjacent said first column-to-I/O control block, said second column-to-I/O control block comprising a second pair of sense bit lines electrically coupled to a second column select I/O block, which extends opposite the first N-type (P-type) sense amplifier block, and a second N-type (P-type) sense amplifier block, which extends opposite the first column select I/O block.

14. The memory device of claim 13, further comprising:
   a column select line extension that is electrically connected to the first and second column select I/O blocks, said column select line extension extending between the second column select I/O block and the second N-type (P-type) sense amplifier block and also between the first column select I/O block and the first N-type (P-type) sense amplifier block.

15. An integrated circuit memory device, comprising:
   a sense amplifier array having a criss-cross arrangement of column select I/O blocks and sense amplifier blocks therein that collectively form a unit cell layout structure having first and third quadrants that contain first and second column select I/O blocks, respectively, and second and fourth quadrants that contain first and second sense amplifier blocks, respectively.

16. The memory device of claim 15, wherein the first column select I/O block comprises a first pair of transistors that are configured to electrically connect a first pair of sense bit lines to a first pair of I/O lines in response to a first column select signal; and wherein the second column select I/O block comprises a second pair of transistors that are configured to electrically connect a second pair of sense bit lines to a second pair of I/O lines in response to the first column select signal.

17. An integrated circuit memory device, comprising:
   a sense amplifier array having a zig-zag layout arrangement of column select I/O blocks therein that span first and second immediately adjacent rows of the sense amplifier array; and
   first and second memory blocks that are electrically connected to first and second opposite sides of said sense amplifier array, respectively.

18. The memory device of claim 17, wherein a layout of four adjacent column select I/O blocks in said sense amplifier array comprises eight column selection transistors; and wherein gate terminals of the eight column selection transistors are electrically connected together by a common polysilicon gate line.

19. An integrated circuit memory device, comprising:
   a zig-zag layout arrangement of four column select I/O blocks within a sense amplifier array, said four column select I/O blocks comprising eight column selection transistors having gate terminals that are electrically connected together by a common polysilicon gate line.

20. The memory device of claim 19, further comprising a column select signal line that is electrically connected to the common polysilicon gate line.

* * * * *